US008823458B2

(12) United States Patent
Leuschner et al.

(10) Patent No.: US 8,823,458 B2
(45) Date of Patent: Sep. 2, 2014

(54) CIRCUIT AND POWER AMPLIFIER

(71) Applicants: Stephan Leuschner, Berlin (DE); Jan-Erik Mueller, Ottobrunn (DE)

(72) Inventors: Stephan Leuschner, Berlin (DE); Jan-Erik Mueller, Ottobrunn (DE)

(73) Assignee: Intel Mobile Communications GmbH, Neubiberg (DE)

( * ) Notice: Subject to any disclaimer, the term of this patent is extended or adjusted under 35 U.S.C. 154(b) by 85 days.

(21) Appl. No.: 13/628,904

(22) Filed: Sep. 27, 2012

(65) Prior Publication Data

US 2013/0082782 A1    Apr. 4, 2013

(30) Foreign Application Priority Data

Sep. 30, 2011    (DE) .......................... 10 2011 083 912

(51) Int. Cl.
*H03F 3/04*    (2006.01)
(52) U.S. Cl.
USPC ............................ 330/311; 330/277; 330/291
(58) Field of Classification Search
USPC ........................................ 330/311, 277, 291
IPC .................................................. H03F 3/04
See application file for complete search history.

(56) References Cited

U.S. PATENT DOCUMENTS

| 4,409,557 | A | * | 10/1983 | Sechi | 330/277 |
| 4,496,909 | A | * | 1/1985 | Knapp | 330/277 |
| 5,387,880 | A | * | 2/1995 | Kobayashi | 330/296 |
| 6,137,367 | A | | 10/2000 | Ezzedine et al. | |
| 7,164,318 | B2 | * | 1/2007 | Costa et al. | 330/283 |
| 7,323,937 | B2 | | 1/2008 | Ooya et al. | |
| 7,368,993 | B2 | * | 5/2008 | Beffa | 330/277 |
| 8,102,207 | B2 | * | 1/2012 | Day | 330/149 |
| 2006/0119435 | A1 | | 6/2006 | Oh et al. | |
| 2009/0184769 | A1 | | 7/2009 | Lee et al. | |
| 2011/0018625 | A1 | | 1/2011 | Hodel et al. | |
| 2012/0229216 | A1 | * | 9/2012 | Benson | 330/291 |

FOREIGN PATENT DOCUMENTS

DE    102009005120 A1    7/2010

OTHER PUBLICATIONS

Non-Final Office Action dated Oct. 22, 2013 for U.S. Appl. No. 13/472,939. 21 Pages.
Wu, e.a., "A 900-MHz 29.5-dBm 0.13-um CMOS HiVP Power Amplifier" IEEE Transactions on Microwave Theory and Techniques. Published in 2008. 6 Pages.
Leuschner, e.a, "A 31-dBm, High Ruggedness Power Amplifier in 65-nm Standard CMOS with High-Efficiency Stacked-Cascode Stages" IEEE Radio Frequency Integrated Circuits Symposium May 23-25, 2010. 6 Pages.
Ezzedine, e.a., "High-Voltage FET Amplifiers for Satellite and Phasedarray Applications" IEEE MTT-S Digest. Published in 1985. 4 Pages.

(Continued)

*Primary Examiner* — Patricia Nguyen
(74) *Attorney, Agent, or Firm* — Eschweiler & Associates, LLC

(57) ABSTRACT

A cascode circuit includes a first transistor and a second transistor. The first transistor and the second transistor are connected to make a cascode. In addition, the circuit has a block capacitance which is connected between a control terminal of the second transistor and a source terminal of the first transistor. In addition, the circuit has a feedback element which is connected between a drain terminal of the second transistor and a control terminal of the first transistor.

17 Claims, 13 Drawing Sheets

(56) References Cited

OTHER PUBLICATIONS

Pornpromlikit, e.a., "A Watt-Level Stacked-FET Linear Power Amplifier in Silicon-on-InsulatorCMOS" IEEE Transactions on Microwave Theory and Techniques, vol. 58, No. 1, Jan. 2010. 8 Pages.

Ezzedine, e.a, "CMOS PA for Wireless Applications" 2007 IEEE Radio and Wireless Symposium, Jan. 2007. 3 Pages.

H. Park, D. Baek, K. Jeon and S. Hong, "A Predistortion Linearizer Using Envelope-Feedback Technique with Simplified Carrier Cancellation Scheme for Class-A and Class-AB Power Amplifiers", IEEE Transactions on Microwave Theory and Techniques, vol. 48, No. 6, Jun. 2000.

N. Delaunay, N. Deltimple, D. Belot, and E. Kerhervé, "Linearization of a 65nm CMOS Power Amplifier with a Cartesian Feedback for W-CDMA Standard", IEEE NEWSCASTAISA '09, Jun. 2009.

H. Liao, J. Chen, H. Chiou and C. Chen, "High-Linearity CMOS Feedforward Power Amplifier for WiMAX application", APMC 2008 Asia-Pacific Microwave Conference, Dec. 2008.

L. Guan and A. Zhu, "Dual-loop Model Extraction for Digital Predistortion of Wideband RF Power Amplifiers", IEEE Microwave and Wireless Components Letters, vol. 21, No. 9, Sep. 2011.

G. Montoro, P. Gilabert, J. Berenguer and E. Bertran, "Digital Predistortion of Envelope Tracking Amplifiers driven by Slew-Rate Limited Enveloples", IEEE MTT-S International, Jun. 2011.

D. Bondar, N.D. Lopez, Z. Popovic and D. Budimir, "Linearization of High-Efficiency Power Amplifiers using Digital Baseband Predistortion with Iterative Injection", Radio and Wireless Symposium (RWS), Jan. 2010.

L. Jixiain and Y. Bin, "Digital Predistortion for Power Amplifiers with Memory Effects", Microwave Conference Proceedings CJMW2011, Apr. 2011.

S. Ko and J. Lin, "A CMOS RF Predistorter using Diode-Connected MOSFET", Microwave and Optical Technology Letters, vol. 49, No. 9, Sep. 2007.

Y. Liao, D. Su, Y. Wang and W. Chen, "A Design of Analog Predistortion Linearizer for RF Power Amplifier to Reduce IMD", 8th International Symposium on Antennas, Propagation and EM Theory (ISAPE 2008), Nov. 2008.

M. Zhao, L. Sun, J. Wen, Z. Yu and J. Kang, "A 2.45 GHz CMOS Power Amplifier with High Linearity", ASICON '09, Oct. 2009.

J. Wang and Z. Liu, "A 900 MHz High Efficiency and Linearity Adaptive CMOS Power Amplifier", International Conference on Electric Information and Control Engineering (ICEICE), Apr. 2011.

C. Lu, A. Pham, M. Shaw and C. Saint, "Linearization of CMOS Broadband Power Amplifiers through Combined Multi-gated Transistors and Capacitance Compensation", IEEE Transactions on Microwave Theory and Techniques, vol. 55, No. 11, 2007.

Q. Liu, S. Jiangtao, Y. Shu, K. Hone, N. Itoh and T. Yoshimasu, "A High Efficiency and High Linearity Power Amplifier utilizing Post-linearization Technique for 5.8 GHz DSRC Applications", Power Amplifiers for Wireless and Radio Applications (PAWR), Jan. 2011.

S. Leuschner, J.E. Müller and H. Klar, "A 1.8 GHz wide-band stacked-cascode CMOS power amplifier for WCDMA applications in 65nm standard CMOS", Radio Frequency Integrated Circuits Symposium (RFIC), Jun. 2011.

U.S. Appl. No. 13/472,939, filed May 16, 2012. 59 Pages.

Office Action Dated Apr. 4, 2014 U.S. Appl. No. 13/472,939.

\* cited by examiner

CIRCUIT AND POWER AMPLIFIER

CROSS-REFERENCE TO RELATED APPLICATIONS

This application is a continuation of German Patent Application No. 102011083912.7, which was filed on Sep. 30, 2011, and is incorporated herein in its entirety by reference.

BACKGROUND

The development trend in integrated circuitry is moving toward increased integration in order to achieve cost savings. In the field of integrated circuits for wireless communication, the term means the inclusion of as many functions/function blocks of the HF transmitter/receiver chain and of the so-called RF front end in a single chip radio (single chip radio transmitter and receiver). Circuit technologies which are compatible with standard CMOS technologies are suitable for the integration of the HF power amplifier. For this, an arrangement called a stacked cascode (see DE 102009005120.1) has proven particularly suitable compared to previously known solutions (as disclosed in, for example, Ezzedine, et al., "HIGH-VOLTAGE FET AMPLIFIERS FOR SATELLITE AND PHASED-ARRAY APPLICATIONS"; Ezzedine, et al., "High Power High Impedance Microwave Devices for Power Applications," U.S. Pat. No. 6,137,367; Ezzedine, et al., "CMOS PA for Wireless Applications"; Wu, et al., "A 900-MHz 29.5-dBm 0.13-um CMOS HiVP Power Amplifier"; and Pornpromlikit, et al., "A Watt-Level Stacked-FET Linear Power Amplifier in Silicon-on-Insulator CMOS"). The advantages of these stacked cascodes are: high electric strength, high efficiency, high power amplification, and lower surface requirements because no additional inductive elements are necessitated. A substantial problem of this circuit technology is the potential instability thereof, particularly at higher frequencies.

SUMMARY

According to an embodiment, a circuit may include: a signal input; a signal output; a first transistor; a second transistor; wherein the first transistor and the second transistor are connected to make a cascode; wherein the cascode is connected between the signal input and the signal output of the circuit; a block capacitor which is connected between a control terminal of the second transistor and a source terminal of the first transistor; and a feedback element, which is connected between a drain terminal of the second transistor and a control terminal of the first transistor.

According to another embodiment, a circuit arrangement may have: a circuit; a further circuit, which is connected between a signal input of the cascode and an input terminal of the circuit arrangement.

According to another embodiment, a circuit may have: a signal input; a signal output; a first transistor; a second transistor; a third transistor; and a fourth transistor. The first transistor and the second transistor are connected to make a cascode. The third transistor and the fourth transistor are connected to make a further cascode. The cascode and the further cascode are stacked in such a manner that a source terminal of the first transistor is connected to a drain terminal of the fourth transistor. A block capacitor is connected between a control terminal of the second transistor and the source terminal of the first transistor. A feedback capacitor is connected between a drain terminal of the second transistor and a control terminal of the first transistor. A capacitance of the feedback capacitor is larger than a capacitance between the drain terminal of the second transistor and the control terminal of the second transistor; where the drain terminal of the second transistor forms the signal output of the circuit and where a control terminal of the third transistor forms the signal input of the circuit.

Another embodiment may have a power amplifier having a circuit arrangement.

Embodiments of the present invention create a circuit with a first transistor and a second transistor. The first transistor and the second transistor are connected to form a cascode. In addition, the circuit has a block capacitance which is connected between a control terminal of the second transistor and a source terminal of the first transistor. In addition, the circuit has a feedback element which is connected between a drain terminal of the second transistor and a control terminal of the first transistor. In addition, the circuit has a signal input and a signal output, wherein the cascode is connected between the signal input and the signal output.

BRIEF DESCRIPTION OF THE DRAWINGS

Embodiments of the present invention will be detailed subsequently referring to the appended drawings, in which:

FIG. 4b shows the effect of a modification of the output voltage in the conventional cascode circuit shown in FIG. 4a.

DETAILED DESCRIPTION

Before the detailed description is given with reference to the attached figures and the following embodiments of the invention, it is hereby noted that identical elements or elements having the same function are indicated by the same reference numbers, and no repeated description is given for elements which are indicated by the same reference numbers. For this reason, descriptions of elements having the same reference numbers are interchangeable.

A substantial problem of the stacked cascodes is the potential instability, especially at higher frequencies. This potential instability is created by a positive feedback loop in the stacked cascodes. This positive feedback is explained below in the context of FIG. 4a and FIG. 4b.

Figure 4A:
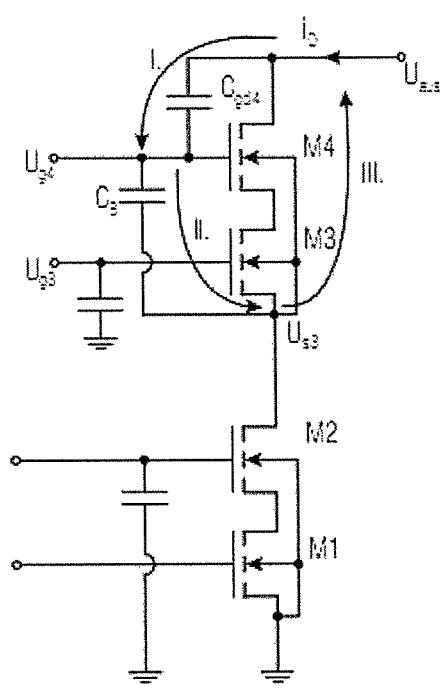
FIG. 4a shows a circuit diagram of a conventional circuit, having a stacked cascode.
Figure 4B:
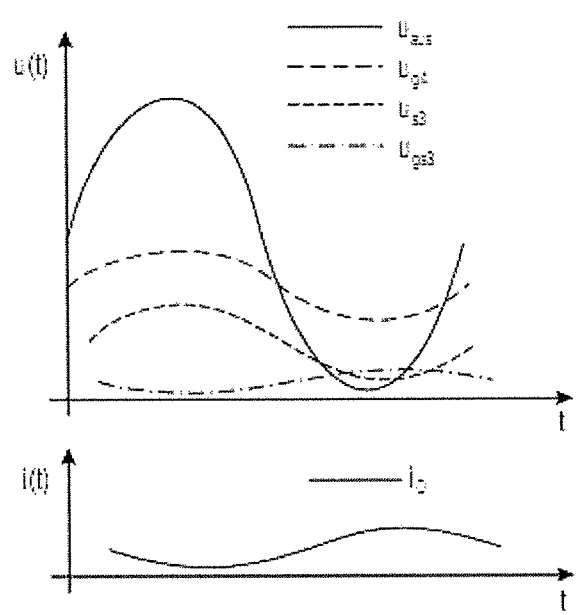

FIG. 4a shows a circuit of a conventional cascode arrangement having a stacked cascode, said arrangement being formed by four transistors M1, M2, M3, M4. The stacked cascodes in this case consist of a lower individual cascode, the same formed by the transistors M1, M2, and an upper individual cascode or cascode circuit, the same formed by the transistors M3, M4. This circuit shown in FIG. 4a is described in detail in Leuschner et al., "A 31-dBm, High Ruggedness Power Amplifier in 65-nm Standard CMOS with High-Efficiency Stacked-Cascode Stages." The parasitic capacitance $C_{gd4}$ between a drain terminal of the transistor M4 and a gate terminal of the transistor M4 is also shown in FIG. 4a.

At high frequencies, the positive feedback loop created by the gate-drain capacitance $C_{gd4}$ of the transistor M4 in common gate configuration in the upper cascode circuit (and/or in the upper cascode circuits—in the case of multiple stacked cascodes) results in an output impedance with a negative real part when the input is passively terminated. This positive feedback is described in greater detail below with reference to FIGS. 4a and 4b.

If the output voltage $u_{aus}$ is modified, this modification is carried over by the capacitive coupling via the gate-drain capacitance $C_{gd4}$ of the transistor M4 to the gate voltage $u_{g4}$ at the gate node of the transistor M4 (I in FIG. 4a). Because the block capacitance $C_B$ between the gate terminal of the transistor M4 and the source terminal of the transistor M3 is very high, the same voltage modification (II) occurs for the source voltage $u_{s3}$ at the source terminal of the transistor M3. This, in turn, effects a modification of the gate source voltage $u_{gs3}$ of the transistor M3, but phase rotated approximately 180° (see FIG. 4b). The current $i_D$ through the transistors M3 and M4 is also accordingly not in phase with the output voltage $u_{aus}$, meaning that an increase of the voltage $u_{aus}$ results in a reduction of this current $i_D$ (and vice-versa). The output impedance therefore has a negative real part and/or a reflection coefficient with a value greater than 1.

In addition, further parasitic capacitances, such as the drain-source capacitances of the transistors M3 and M4, for example, can lead to unstable behavior via the mechanism described.

Figure 4C:
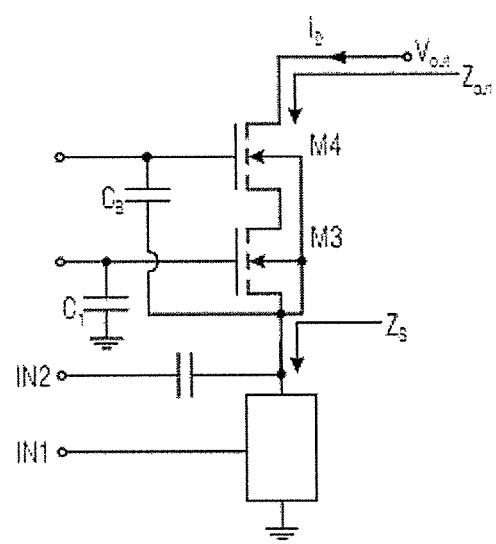
FIG. 4c shows a generalized circuit diagram of a conventional stacked cascode arrangement.

FIG. 4a represents only one of the possible cases, where a cascode circuit (in this case formed by the transistors M3, M4) is placed in series with another circuit component (wherein the latter can be active or passive). In every situation where such a connection occurs, the instability described above can occur. FIG. 4c therefore shows the general case of such an arrangement, having the upper cascode circuit formed by the transistors M4, M3 and a lower circuit component connected to the source terminal of the transistor M3. Depending on the specifications of the lower circuit component, the input of the amplified stage having this form can either be a part of the lower circuit component itself (IN1) or can be on the source node of the transistor M3 (IN2).

The instability is appreciated and addressed as described below.

Figure 1A:
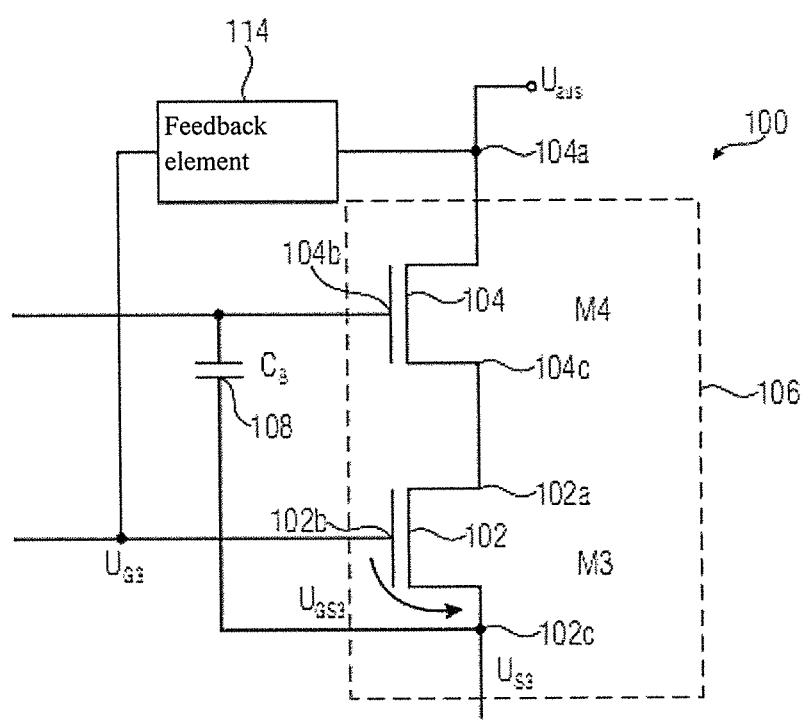
FIG. 1a shows an equivalent circuit diagram of a circuit according to one embodiment of the present invention.

FIG. 1a shows a (cascode) circuit 100 or cascode arrangement 100 according to one embodiment of the present invention. The circuit 100 has a first transistor 102 (corresponding to the transistor M3 in FIG. 4a, for example) and a second transistor 104 (corresponding to the transistor M4 in FIG. 4a). The first transistor 102 and the second transistor 104 are connected to form a cascode 106. The first transistor 102 has a drain terminal 102a, a control terminal 102b, and a source terminal 102c. The second transistor 104 has a drain terminal 104a, a control terminal 104b, and a source terminal 104c. The cascode 106 is formed by connecting the drain terminal 102a of the first transistor 102 to the source terminal 104c of the second transistor 104 (for example by a conductor). In addition, the circuit 100 has a signal input and a signal output, wherein the cascode 106 is connected between the same. In the embodiment shown in FIG. 1a, the signal input of the circuit 100 is formed by the source terminal 102c of the first transistor 102, and the signal output is formed by the drain terminal 104a of the second transistor 104.

The transistors in the circuit 100 and in the following embodiments can be MOSFET, MESFET, BJT, HBT, HEMT, bipolar, n-type or p-type transistors, for example.

In addition, a source terminal of a transistor can be, for example, a source terminal or an emitter terminal of the transistor, a drain terminal can be a drain terminal or a collector terminal of the transistor, and a control terminal can be a gate terminal or a base terminal of the transistor. A primary transistor current of a transistor typically flows from the source terminal to the drain terminal or vice-versa.

The circuit 100 further has a block capacitance 108 (for example comparable to the block capacitance $C_B$ in FIG. 4a). The block capacitance 108 is connected between the control terminal 104b of the second transistor 104 and the source terminal 102c of the first transistor 102.

In addition, the circuit 100 has a feedback element 114 (or a feedback arrangement 114). The feedback element 114 is connected between the drain terminal 104a of the second transistor 104 and the control terminal 102b of the first transistor 102.

By means of the connection of the feedback element 114 between the drain terminal 104a of the first transistor 104 and the control terminal 102b of the second transistor 102, it is possible to avoid or at least dampen the instabilities described above. It has been discovered that, because a positive/negative voltage modification of the output voltage $u_{aus}$ results in a corresponding modification of the (source) voltage $u_{s3}$ at the source terminal 102c of the second transistor 102, and also therefore results in a 180° shift in the (gate-source) voltage $u_{GS3}$ between the control terminal 102b and the source terminal 102c of the second transistor 102, it is possible to modify the (gate) voltage $u_{G3}$ at the control terminal 102b of the second transistor 102 (at least) to the same degree as the voltage $u_{S3}$ at the source terminal 102c of the second transistor 102. In the case of the circuit 100 shown in FIG. 1a, this is achieved by the feedback element 114 (for example having a feedback network, or formed by a feedback network) between the drain terminal 104a (for example drain 104a) of the second transistor 104 and the control terminal 102b (for example gate 102b) of the first transistor 102. The drain terminal 104a of the second transistor 104 can, as already mentioned, form a signal output or an output terminal of the circuit 100, for example.

In addition, as already mentioned, the source terminal 102c of the first transistor 102 can form a signal input or input terminal of the circuit 100 and the cascode 106.

The signal input 102c can be a high-frequency signal input for the purpose of receiving a high-frequency signal, for example.

As already explained above, the cascode 106 and/or the circuit 100 can be disposed in series with a further circuit component or a further circuit. This is shown schematically in FIG. 1b.

Figure 1B:
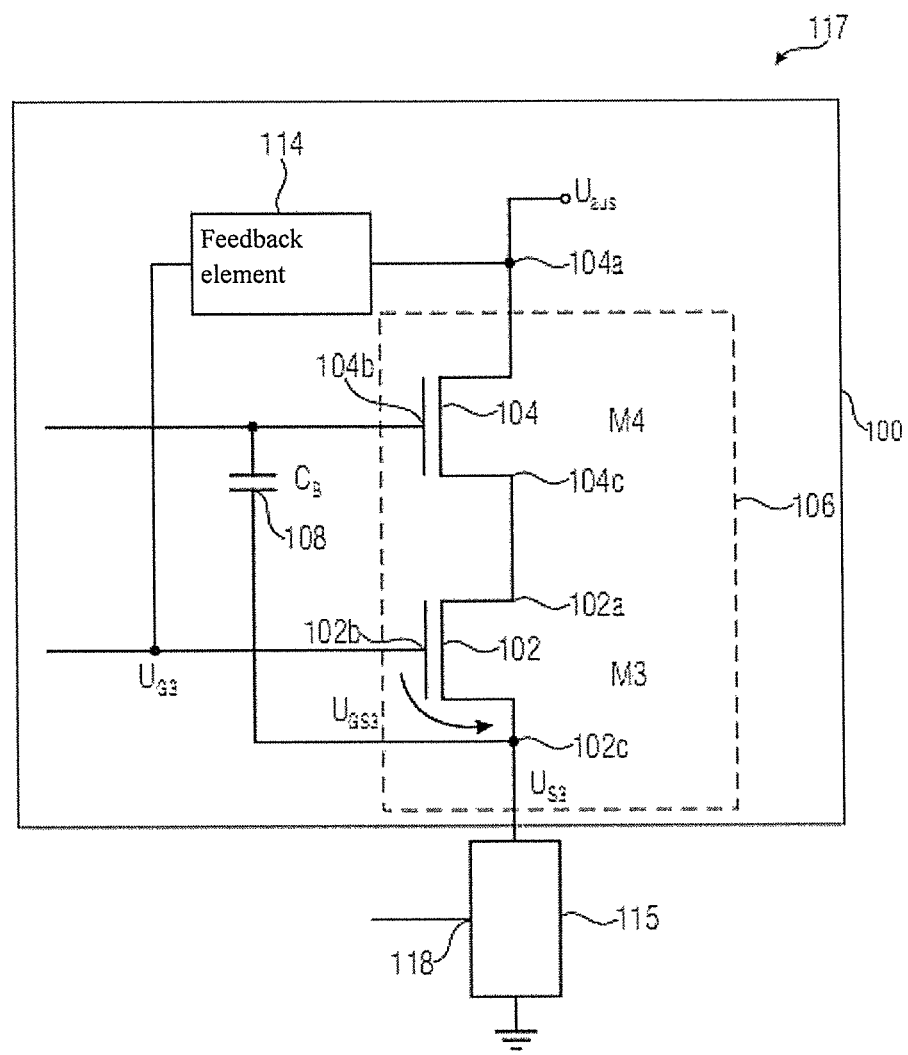
FIG. 1b shows an equivalent circuit diagram of a circuit arrangement according to one embodiment of the present invention.

FIG. 1b shows a circuit arrangement 117 which has the circuit 100 and a further circuit 115. The further circuit 115 is connected between a signal input 118 of the circuit arrangement 117 and the signal input 102c of the cascode 106 and/or of the circuit 100. The further circuit 115 can have passive and/or active components, for example. The further circuit 115 can be optionally grounded. For example, the further circuit 115 can be connected to a ground terminal, as shown in FIG. 1b. By way of example, the further circuit 115 can have a further cascode which is connected to the cascode 106 in series, for example, in order to obtain a stacked circuit and/or stacked cascode as a result.

Figure 2:
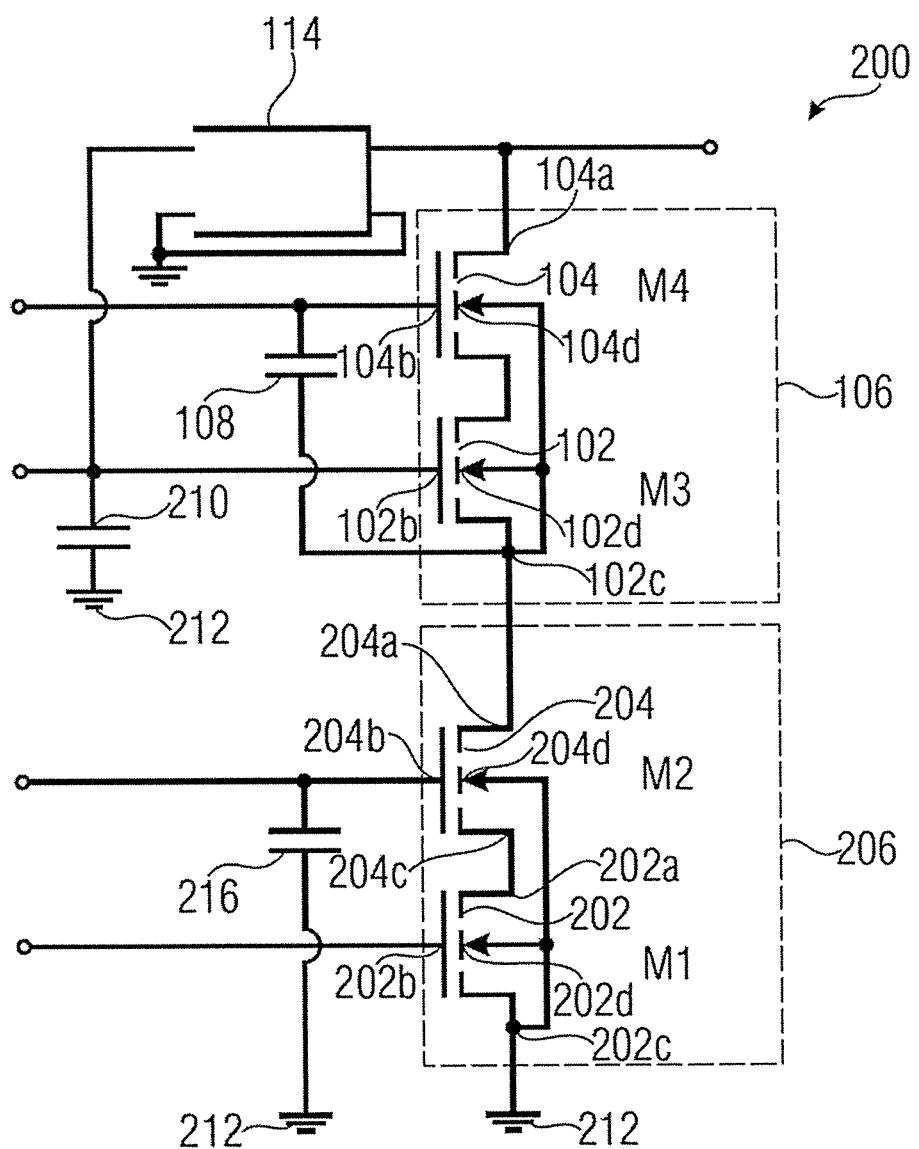
FIG. 2 shows an equivalent circuit diagram of a circuit having a stacked cascode according to one embodiment of the present invention.

Such a cascode arrangement or circuit 200 is shown in FIG. 2. The circuit 200 differs from the circuit 100 in that it has a third transistor 202 and a fourth transistor 204 which are connected to a further cascode 206. The cascode 106 and the further cascode 206 are stacked in such a manner that the source terminal 102c of the first transistor 102 is connected to a drain terminal 204a of the fourth transistor 204. An input terminal or signal input of the circuit 200 can be formed by a control terminal 202b of the third transistor 202, for example. The signal input 202b of the circuit 200 can be the same as the signal input 118 of the further circuit 115 of the circuit arrangement 117 in FIG. 1b, for example, and the further circuit can be formed by the further cascode 206.

In addition, the circuit 200 has a first blocking capacitor 210 which is connected between a supply potential terminal 212 (for example a ground terminal) of the circuit 200 and the control terminal 102b of the first transistor 102.

In addition, the circuit 200 has a further blocking capacitor 216 which is connected between a control terminal 204b of the fourth transistor 204 and the supply potential terminal 212.

A source terminal 202c of the third transistor 202 is connected to the supply potential terminal 212. In addition, a substrate terminal 202d of the third transistor 202 and a substrate terminal 204d of the fourth transistor 204 are connected to the source terminal 202c of the third transistor 202 and the supply potential terminal 212 of the circuit 200. As in the prior case of the cascode 106, the further cascode 206 is formed by the connection of a drain terminal 202a of the third transistor 202 to a source terminal 204c of the fourth transistor 204. In addition, a substrate terminal 102d of the first transistor 102 and a substrate terminal 104d of the second transistor 104 are connected to the source terminal 102c of the first transistor 102.

The connections of the substrate terminals of the transistors shown in FIG. 2 and in the following figures can be not absolutely necessitated if other transistor technologies are used instead of the shown MOS technology for the transistors; or, if these other technologies are used, the transistors can have no substrate terminals whatsoever.

The feedback element 114 offers a simple, space-saving method for stabilizing the stacked cascode circuit shown in FIG. 2 (formed by the cascode 106 and the further cascode 206), as well as the numerous possible embodiments thereof. By means of inserting an additional feedback path (of the feedback element 114) at a suitable location (between the drain terminal 104a of the first transistor 104 and the control terminal 102b of the second transistor 102), it is possible to compensate positive feedback arising as the result of parasitic capacitances. The concept described here is suitable for the stabilization of any embodiment of the stacked cascode, independent of the type of transistor selected (n-/p-type, MOS-/MESFET, BJT, HBT, HEMT, bipolar, etc.) or the number of stacked transistors/cascodes.

Because the positive feedback produced by the gate-drain capacitance $C_{gd4}$ becomes stronger at higher frequencies, this stabilization method utilizing the feedback element 114 is indispensable for the use of stacked cascodes at higher operating frequencies. Additional embodiments of this stabilization method and/or of the feedback element 114 are shown below with reference to FIGS. 3a to 3g.

The embodiments described below are based on the principle described in FIG. 2, but utilize different feedback elements (and/or feedback networks), which lead to different characteristics of the circuit as a whole. The following circuits each comprise the stacked cascodes made up of the cascode 106 and the further cascode 206. However, as already described above, in the further embodiments, another circuit component can also be used in place of the further cascode 206. The feedback element 114 in this case can be selected according to the circuit component (which is connected to the source terminal 102c of the first transistor 102).

In order to render the image more clearly, not all reference numbers are included in the illustrations below.

Figure 3A:
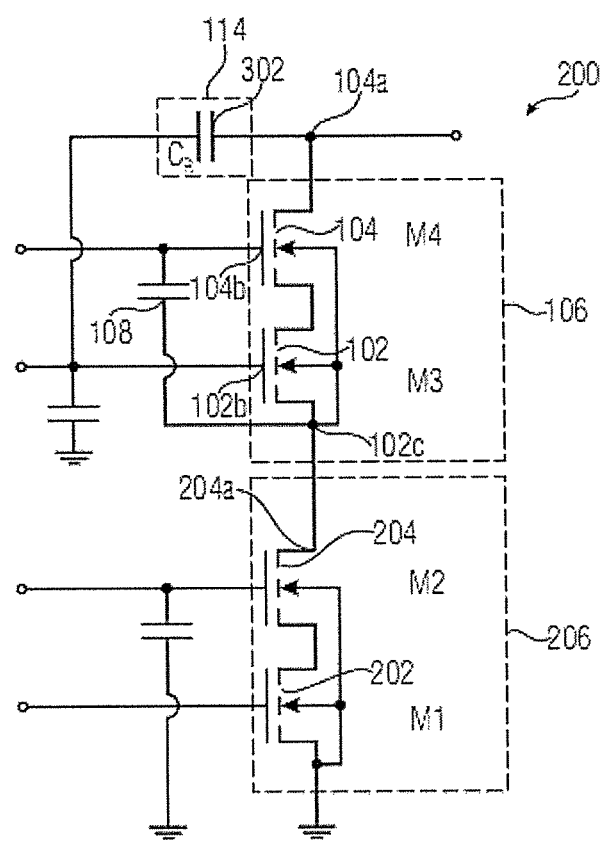
FIG. 3a-3g shows circuit diagrams of circuits according to various embodiments of the present invention, having different implementations for a feedback element.

FIG. 3a shows a first option for the implementation of the feedback element 114 as a feedback capacitor 302 (or a feedback capacitance 302) which is connected between the drain terminal 104a of the second transistor 104 and the control terminal 102b of the first transistor 102. The feedback element 114 can be formed entirely by this feedback capacitor 302. Because the compensating effect is caused by the gate-drain capacitance, the feedback capacitor 302 can likewise be used as the coupling network and/or as the feedback element 114. A capacitance ($C_R$) of the feedback capacitor 302 is selected to be larger than the gate-drain capacitance $C_{gd4}$ between the drain terminal 104a and the control terminal 104b of the first transistor 104 in order to make allowance for the influence of the capacitances of the first transistor 102 and for further parasitic capacitances.

In summary, FIG. 3a shows a realization of the feedback element 114 having the feedback capacitor 302, where a first terminal of the feedback capacitor 302 is connected to the drain terminal 104a of the first transistor 104, and a second terminal of the feedback capacitor 302 is connected to the control terminal 102b of the second transistor 102.

Figure 3B:
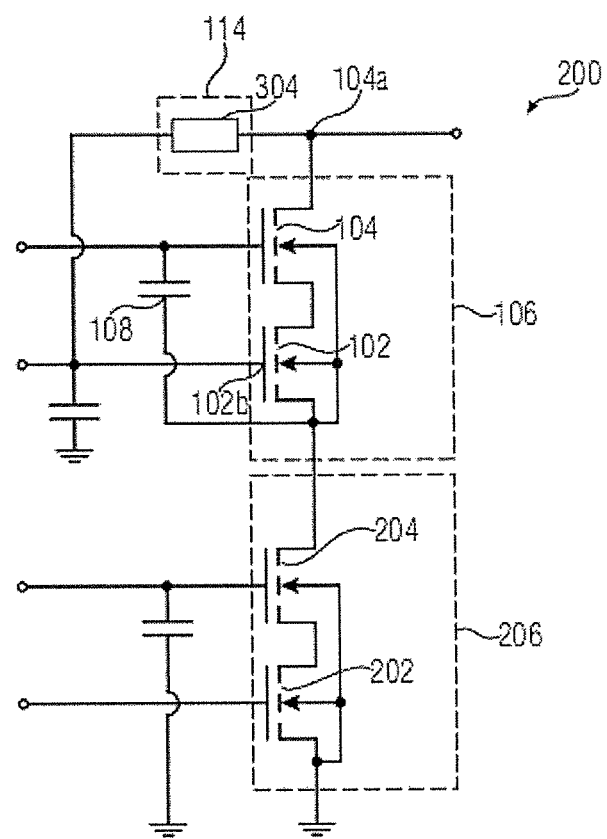

The implementation of the feedback element 114 shown in FIG. 3b only uses a feedback resistance element 304 (or a feedback resistor 304) for the feedback coupling. This simple stabilization leads to a particularly compact layout. The feedback resistance element 304 is connected between the drain terminal 104a of the first transistor 104 and the control terminal 102b of the second transistor 102. According to some of the embodiments, the feedback element 114 can be formed exclusively by the feedback resistance element 304, as shown in FIG. 3b. A first terminal of the feedback resistance element 304 can be connected to the drain terminal 104a of the second transistor 104, and a second terminal of the feedback resistance element 304 can be connected to the control terminal 102b of the first transistor 102.

Figure 3C:
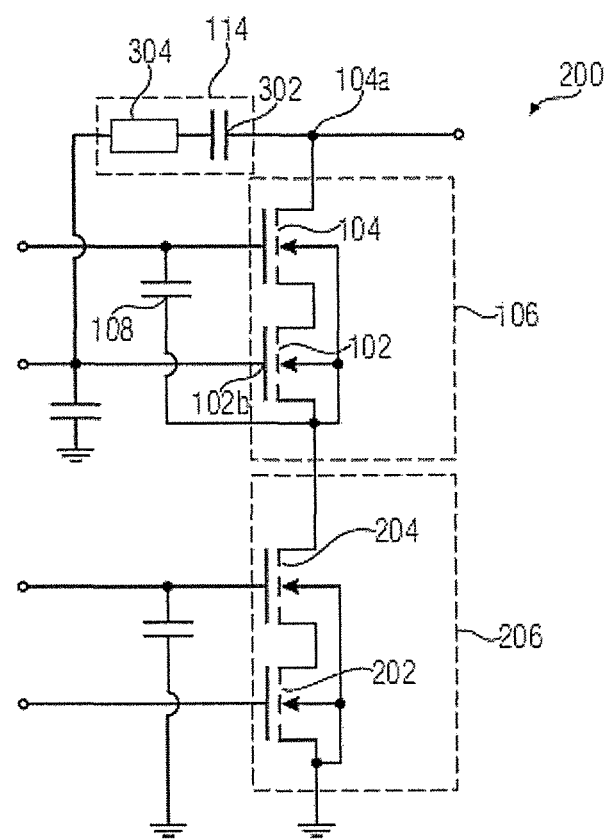

In the circuit 200 shown in FIG. 3c, the stabilization is realized by means of an RC member (formed by a series connection of the feedback capacitor 302 and the feedback resistance element 304). In contrast to the purely capacitive stabilization (as was shown in FIG. 3a), the conductance of the feedback network (of the feedback element 114) is limited at high frequencies by means of the additional feedback resistance element 304. As such, the harmonics are less strongly degenerated, whereby an improved switching behavior of the stabilized PA stage (power amplifier), and therefore higher efficiency, results.

In summary, in the case of the circuit 200 shown in FIG. 3c, the feedback element 114 is (entirely) formed by the RC series connection of the feedback resistance element 304 and the feedback capacitor 302. A first terminal of the RC series circuit in this case can be connected to the drain terminal 104a of the first transistor 104, and a second terminal of the RC series circuit can be connected to the control terminal 102b of the second transistor 102.

Figure 3D:
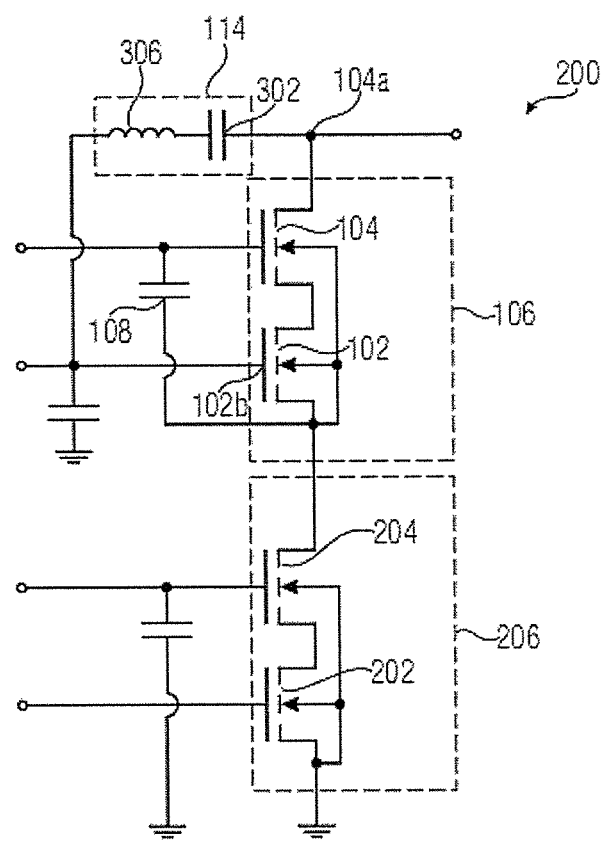

FIG. 3d shows one implementation of the feedback element 114 by a series-resonant circuit, formed by the feedback capacitor 302 and a feedback inductor 306, connected to each other in series.

A first terminal of the series-resonant circuit in this case can be connected to the drain terminal 104a of the second transistor 104, and a second terminal of the series-resonant circuit can be connected to the control terminal 102b of the first transistor 102.

Figure 3E:
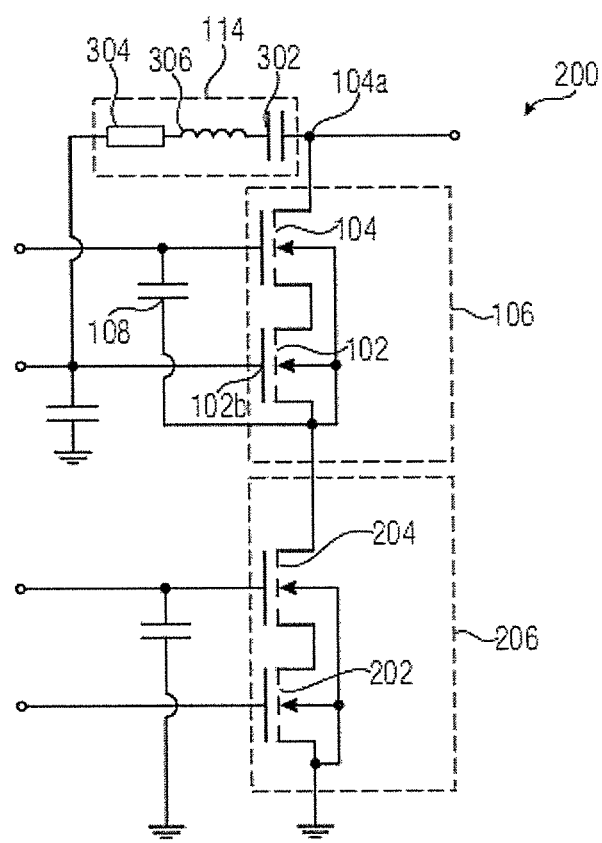

FIG. 3e shows one implementation of the feedback element 114, having a dampened series-resonant circuit, formed by a series connection of the feedback capacitor 302, the feedback inductor 306, and the feedback resistance element 304.

A first terminal of the damped series-resonant circuit can be connected to the drain terminal 104a of the second transistor 104. A second terminal of the damped series-resonant circuit can be connected to the control terminal 102b of the first transistor 102.

The implementations of the feedback element 114 shown in FIGS. 3d and 3e having a series-resonant circuit (FIG. 3d) or a damped series-resonant circuit (FIG. 3e) enable a still-greater control over amplitudes and phase difference of the feedback network or the feedback element 114, with a corresponding potentially higher efficiency of the PA stage. Such a circuit is by principle narrow-band.

In addition, multi-circuit filters can be contemplated as the feedback network or the feedback element 114. These offer the possibility of a broadband stabilization with simultaneously better control of the feedback impedance for the harmonics, and therefore better efficiency.

The possibility of designing configurable circuits as switches in CMOS technologies by the use of MOSFETs carries special significance. Corresponding concepts can also be realized in embodiments of the present invention for circuit stabilization. In this manner, it is possible to adaptively match the circuit characteristics to relevant operation conditions.

Figure 3F:
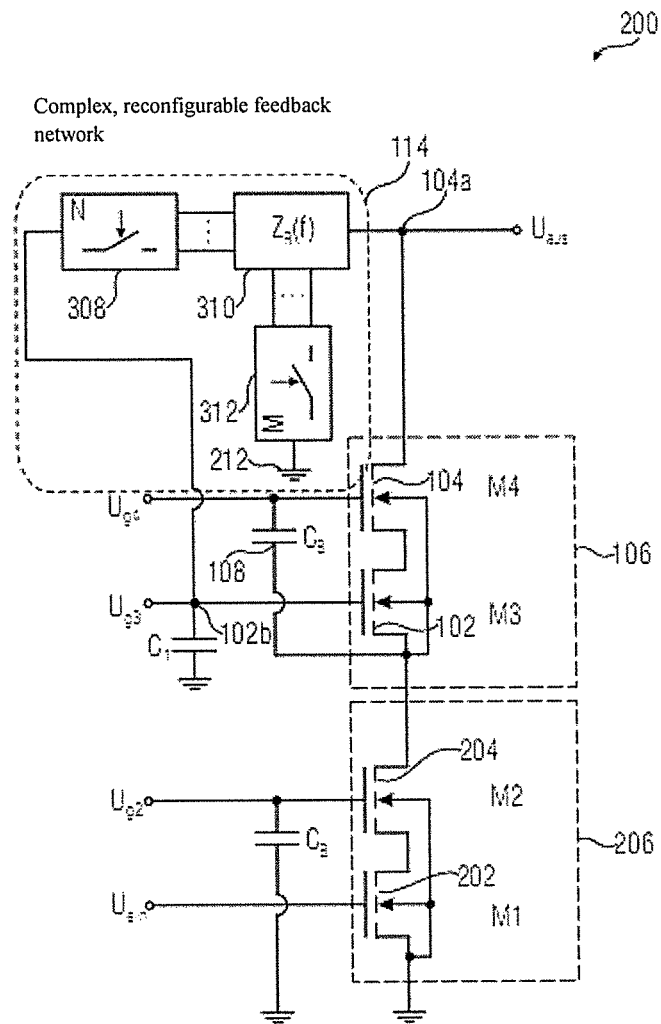

FIG. 3f shows a general circuit diagram of such a reconfigurable stabilization. In this case, the feedback element 114 can have a reconfigurable feedback network. This reconfigurable feedback network can have a plurality (N) of series switches 308. In addition, the reconfigurable feedback network can have a plurality of impedance elements 310 ($Z_R(f)$). The series switches 308 and the impedance elements 310 in this case can be connected between the drain terminal 104a of the second transistor 104 and the control terminal 102b of the first transistor 102. For example, an impedance element from the plurality of impedance elements 310 can be connected to a series switch 308 in order to conductively couple the drain terminal 104a of the second transistor 104 to the control terminal 102b of the first transistor 102 by the impedance element when the series switch is in a low-impedance state. Because the circuit 200 typically is used for the amplification of alternating voltage signals, such a conductive coupling can also take place if the impedance element has a capacitor (for example, the feedback capacitor 302) connected in series (between the drain terminal 104a of the second transistor 104 and the control terminal 102b of the first transistor 102).

In addition, the reconfigurable feedback network can have a plurality (M) of parallel switches 312. The parallel switches 312 in this case can be connected between the plurality of impedance elements 310 and the supply potential terminal 212 (for example, the ground terminal or supply potential terminal of the circuit 200). For example, an impedance element from the plurality of impedance elements 310 can be connected to a parallel switch from the plurality of parallel switches 312. In other words, it is possible to modify the characteristics of a passive feedback network (formed by the impedance elements 310), indicated here by $Z_R(f)$, and the coupling function thereof between the output node 104a ($u_{aus}$) and the control terminal 102b (gate) of the first transistor 102, via N series switches 308 and M parallel switches 312 to ground, according to the switch position.

Figure 3G:
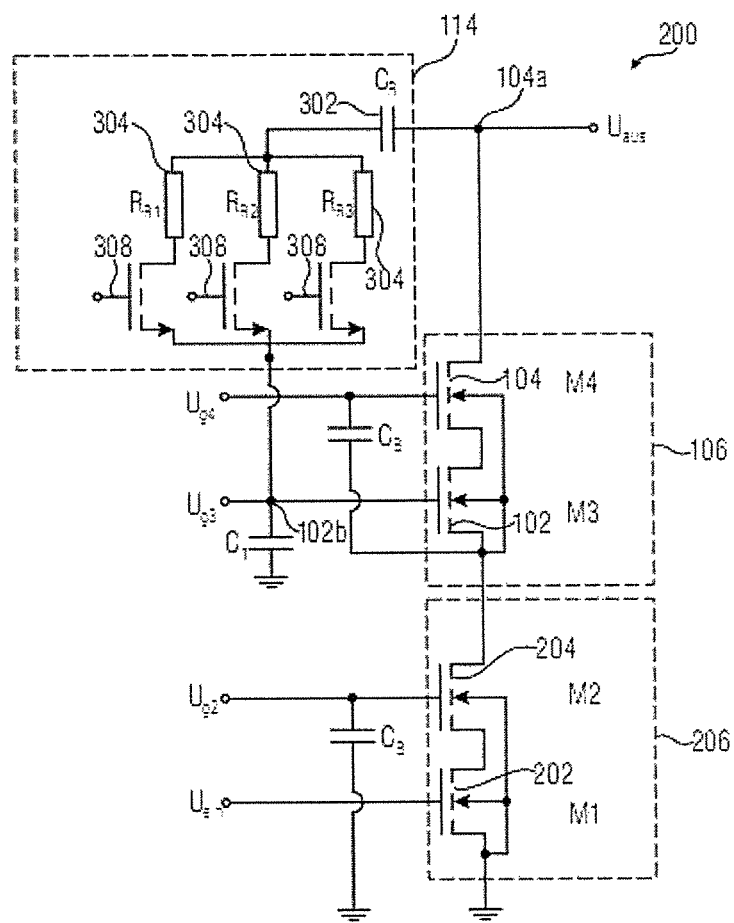

One possible implementation is shown in FIG. 3g via the example of a reconfigurable RC stabilization network. The reconfigurable RC stabilization network shown in FIG. 3g (which forms the feedback element 114) comprises the feedback capacitor 302, which is connected in series to a plurality of feedback resistance elements 304, which are connected in parallel. In addition, the reconfigurable RC stabilization network has a plurality of series switches 308 (for example, formed by single transistor switches or transmission gates), which are connected between the plurality of feedback resistance elements 304 and the control terminal 102b of the first transistor 102.

A feedback resistance element 304 therefore forms, together with a series switch 308 which is connected in series to the feedback resistance element 304, a switchable feedback resistance element.

According to further embodiments, the series switch 308 can also be connected before the feedback resistance elements 304. This means, for example, in such a manner that the series switches 308 are connected between the feedback capacitor 302 and the feedback resistance elements 304. By means of the connection shown in FIG. 3g, the RC stabilization network can be adapted to different requirements by connecting or disconnecting the different feedback resistance elements 304.

According to further embodiments, the feedback resistance elements 304 can have different resistance values from each other.

According to further embodiments, it is also possible to insert a transistor into the stabilization network (the feedback element 114) as a controllable bias-dependent resistor. In other words, in the case of circuits according to further embodiments, a transistor can also be used as a controllable bias-dependent feedback resistor as a component of the feedback element 114.

In addition, the impedance elements 310 can also have complex values. As such, an impedance element from the plurality of impedance elements 310 can have, for example, one or more feedback capacitors and/or one or more feedback inductors and/or one or more feedback resistors.

In summary, embodiments of the present invention enable a circuit, for example for a high-frequency power amplifier, having a stable behavior.

Additional embodiments of the present invention create a power amplifier having a cascode circuit according to an embodiment of the present invention (for example having the cascode circuit 100 or the cascode circuit 200).

Although some aspects are described in the context of a device, it should be understood that these aspects also constitute a description of the corresponding method, such that a block or a component of a device is also understood to be a corresponding method step or a feature of a method step. In an analogous manner, aspects which were described in the context of a method step or as a method step also constitute a description of a corresponding block or detail or feature of a corresponding device.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A circuit comprising the following features:
a signal input;
a signal output;
a first transistor;
a second transistor;
wherein the first transistor and the second transistor are connected to make a cascode;
wherein the cascode is connected between the signal input and the signal output of the circuit;
a block capacitor which is connected between a control terminal of the second transistor and a source terminal of the first transistor; and
a feedback element, which is connected between a drain terminal of the second transistor and a control terminal of the first transistor;
wherein the feedback element comprises a reconfigurable feedback network.

2. A circuit comprising the following features:
a signal input;
a signal output;
a first transistor;
a second transistor;
wherein the first transistor and the second transistor are connected to make a cascode;
wherein the cascode is connected between the signal input and the signal output of the circuit;
a block capacitor which is connected between a control terminal of the second transistor and a source terminal of the first transistor; and
a feedback element, which is connected between a drain terminal of the second transistor and a control terminal of the first transistor;
wherein the feedback element comprises a feedback inductor connected between the drain terminal of the second transistor and the control terminal of the first transistor.

3. The circuit according to claim 2, wherein the feedback element further comprises a feedback resistance element connected between the drain terminal of the second transistor and the control terminal of the first transistor.

4. The circuit according to claim 2, wherein the feedback element further comprises a feedback capacitor connected between the drain terminal of the second transistor and the control terminal of the first transistor.

5. The circuit according to claim 4, wherein a capacitance of the feedback capacitor is larger than a capacitance between the drain terminal of the second transistor and the control terminal of the second transistor.

6. The circuit according to claim 1,
wherein the reconfigurable feedback network comprises a plurality of series switches and a plurality of impedance elements; and
wherein the series switches and the impedance elements are connected between the drain terminal of the second transistor and the control terminal of the first transistor in such a manner that one impedance element from the plurality of impedance elements is connected to a series switch from the plurality of series switches.

7. The circuit according to claim 1,
wherein the reconfigurable feedback network comprises a plurality of parallel switches and a plurality of impedance elements;
wherein the impedance elements are connected between the drain terminal of the second transistor and the control terminal of the first transistor; and
wherein the parallel switches are connected between the impedance elements and a supply potential terminal of the circuit in such a manner that one impedance element from the plurality of impedance elements is connected to a parallel switch from the plurality of parallel switches.

8. The circuit according to claim 1,
wherein the reconfigurable feedback network comprises a feedback capacitor and a plurality of switchable feedback resistance elements which are connected to each other in parallel; and
wherein the feedback capacitor and the plurality of switchable feedback resistance elements are connected between the drain terminal of the second transistor and the control terminal of the first transistor in such a manner that the feedback capacitor is coupled to the plurality of switchable feedback resistance elements.

9. The circuit according to claim 1, wherein a drain terminal of the first transistor is connected to a source terminal of the second transistor in order to form the cascode.

10. The circuit according to claim 1, wherein the source terminal of the first transistor forms a signal input of the cascode, and the drain terminal of the second transistor forms the signal output of the circuit.

11. The circuit according to claim 1, further comprising a third transistor and a fourth transistor;
wherein the third transistor and the fourth transistor are connected to make a further cascode; and
wherein the cascode and the further cascode are stacked in such a manner that the source terminal of the first transistor is connected to a drain terminal of the fourth transistor.

12. The circuit according to claim 1, wherein the source terminal of the first transistor forms a high-frequency signal input of the cascode.

13. A circuit arrangement comprising the following features:
a circuit comprising the following features:
a signal input;
a signal output;
a first transistor;
a second transistor;
wherein the first transistor and the second transistor are connected to make a cascode;
wherein the cascode is connected between the signal input and the signal output of the circuit;
a block capacitor which is connected between a control terminal of the second transistor and a source terminal of the first transistor; and
a feedback element, which is connected between a drain terminal of the second transistor and a control terminal of the first transistor; and
a further circuit, which is connected between a signal input of the cascode and an input terminal of the circuit arrangement.

14. The circuit arrangement according to claim 13, wherein the further circuit is connected to a ground terminal.

15. A circuit comprising the following features:
a signal input;
a signal output;
a first transistor;
a second transistor;
a third transistor;
a fourth transistor;
wherein the first transistor and the second transistor are connected to make a cascode;
wherein the third transistor and the fourth transistor are connected to make a further cascode; and wherein the cascode and the further cascode are stacked in such a manner that a source terminal of the first transistor is connected to a drain terminal of the fourth transistor;
a block capacitor which is connected between a control terminal of the second transistor and the source terminal of the first transistor;
a feedback capacitor which is connected between a drain terminal of the second transistor and a control terminal of the first transistor; and
wherein a capacitance of the feedback capacitor is larger than a capacitance between the drain terminal of the second transistor and the control terminal of the second transistor;
wherein the drain terminal of the second transistor forms the signal output of the circuit;
wherein a control terminal of the third transistor forms the signal input of the circuit.

16. A power amplifier comprising a circuit arrangement, the circuit arrangement comprising the following features:
a circuit comprising the following features:
a signal input;
a signal output;
a first transistor;
a second transistor;
wherein the first transistor and the second transistor are connected to make a cascode;
wherein the cascode is connected between the signal input and the signal output of the circuit;
a block capacitor which is connected between a control terminal of the second transistor and a source terminal of the first transistor; and
a feedback element, which is connected between a drain terminal of the second transistor and a control terminal of the first transistor; and
a further circuit, which is connected between a signal input of the cascode and an input terminal of the circuit arrangement.

17. A power amplifier comprising a circuit, the circuit comprising the following features:
a signal input;
a signal output;
a first transistor;
a second transistor;
a third transistor;
a fourth transistor;
wherein the first transistor and the second transistor are connected to make a cascode;
wherein the third transistor and the fourth transistor are connected to make a further cascode; and
wherein the cascode and the further cascode are stacked in such a manner that a source terminal of the first transistor is connected to a drain terminal of the fourth transistor;
a block capacitor which is connected between a control terminal of the second transistor and the source terminal of the first transistor;
a feedback capacitor which is connected between a drain terminal of the second transistor and a control terminal of the first transistor; and
wherein a capacitance of the feedback capacitor is larger than a capacitance between the drain terminal of the second transistor and the control terminal of the second transistor;
wherein the drain terminal of the second transistor forms the signal output of the circuit;
wherein a control terminal of the third transistor forms the signal input of the circuit.

\* \* \* \* \*